US007732898B2

(12) United States Patent
Barth

(10) Patent No.: US 7,732,898 B2

(45) Date of Patent: Jun. 8, 2010

(54) ELECTRICAL FUSE AND ASSOCIATED METHODS

(75) Inventor: Hans-Joachim Barth, Munich (DE)

(73) Assignee: Infineon Technologies AG, Nuebiberg (DE)

(*) Notice: Subject to any disclaimer, the term of this patent is extended or adjusted under 35 U.S.C. 154(b) by 237 days.

(21) Appl. No.: 11/670,770

(22) Filed: Feb. 2, 2007

(65) Prior Publication Data

US 2008/0186788 A1 Aug. 7, 2008

(51) Int. Cl.
*H01L 23/62* (2006.01)

(52) U.S. Cl. ................ 257/665; 257/529; 257/E23.149

(58) Field of Classification Search ................ 257/665, 257/E23.149, 529
See application file for complete search history.

(56) References Cited

U.S. PATENT DOCUMENTS

| | | | | |
|---|---|---|---|---|
| 5,883,000 | A * | 3/1999 | Pasch | 438/618 |
| 6,933,591 | B1 * | 8/2005 | Sidhu et al. | 257/665 |
| 2002/0086462 | A1 | 7/2002 | Kothandaraman et al. | |
| 2002/0113291 | A1 | 8/2002 | Adkisson et al. | |
| 2003/0160297 | A1 | 8/2003 | Kothandaraman et al. | |
| 2003/0205777 | A1 | 11/2003 | Ito et al. | |
| 2003/0211661 | A1 | 11/2003 | Marr et al. | |
| 2004/0038458 | A1 | 2/2004 | Marr et al. | |
| 2004/0056325 | A1 | 3/2004 | Kothandaraman | |
| 2004/0099953 | A1 | 5/2004 | Liaw | |
| 2004/0222491 | A1 | 11/2004 | Ito et al. | |
| 2004/0224444 | A1 | 11/2004 | Hisaka | |
| 2005/0052892 | A1 * | 3/2005 | Low et al. | 365/94 |
| 2005/0087836 | A1 | 4/2005 | Wu | |
| 2005/0101114 | A1 | 5/2005 | Daubenspeck et al. | |
| 2005/0121741 | A1 | 6/2005 | Voldman | |
| 2005/0124097 | A1 | 6/2005 | Xiang | |
| 2005/0158919 | A1 | 7/2005 | Marr et al. | |
| 2005/0189613 | A1 * | 9/2005 | Otsuka et al. | 257/529 |
| 2005/0221539 | A1 | 10/2005 | Kim et al. | |
| 2005/0236688 | A1 | 10/2005 | Bang et al. | |
| 2005/0258505 | A1 | 11/2005 | Wu et al. | |
| 2005/0258506 | A1 | 11/2005 | Brintzinger et al. | |
| 2005/0258990 | A1 * | 11/2005 | Babcock et al. | 341/121 |
| 2005/0285222 | A1 | 12/2005 | Thei et al. | |
| 2006/0002187 | A1 | 1/2006 | Forbes | |
| 2006/0006494 | A1 | 1/2006 | Wu | |
| 2006/0022300 | A1 | 2/2006 | Wu et al. | |
| 2006/0030083 | A1 | 2/2006 | Wu | |
| 2006/0081959 | A1 | 4/2006 | Dondero et al. | |
| 2006/0087001 | A1 | 4/2006 | Kothandaraman et al. | |
| 2006/0108662 | A1 | 5/2006 | Kothandaraman et al. | |
| 2006/0157819 | A1 | 7/2006 | Wu | |
| 2006/0189042 | A1 | 8/2006 | Sakoh et al. | |
| 2006/0208274 | A1 | 9/2006 | Wu | |
| 2006/0223242 | A1 | 10/2006 | Daubenspeck et al. | |
| 2007/0252237 | A1 * | 11/2007 | Ko et al. | 257/529 |

* cited by examiner

*Primary Examiner*—Tu-Tu V Ho
(74) *Attorney, Agent, or Firm*—SpryIP, LLC

(57) ABSTRACT

A fuse link of undoped material is connected between first and second doped material contact regions and a layer of conductive material is located above the first and second contact regions and the fuse link. According to other embodiments, a fuse link is connected between first and second contact regions. A layer of conductive material is above the first and second contact regions and the fuse link, and a heat sink is in proximity to the fuse link. In a method, a programming pulse is applied to a fuse link of undoped material connected between first and second doped material contact regions to generate electromigration drift of a conductive material above the first and second contact regions and the fuse link.

39 Claims, 6 Drawing Sheets

ELECTRICAL FUSE AND ASSOCIATED METHODS

TECHNICAL FIELD

The subject matter relates generally to electrical fuses and associated methods in connection with such fuses.

BACKGROUND

Electronic devices include electrical fuse structures to have electrical connections that can be ruptured by a voltage pulse during a programming operation. There is a need for improved electrical fuses and methods of operating electrical fuses.

DETAILED DESCRIPTION

The various embodiments described herein are merely illustrative. Therefore, the various embodiments shown should not be considered as limiting of the claims.

The reliability of electrical fuses depends heavily on the fusing or programming conditions of a fuse link including, for example, an electrical fuse current, rise and fall times of a programming voltage pulse, an absolute temperature and a temperature gradient during programming, and a geometrical and electrical layout of the fuse link and its surroundings, among other factors. Temperature storage of programmed polysilicon electrical fuses with silicide overcoats show an unwanted effect, that a high resistance of greater than 10 kohms, for example, may be degraded to a few kohms or less after the fusing process because of temperature driven reorganization or diffusion of the material in the open (high ohmic) fuse link. In addition, the high temperatures, for example up to 1000 degrees Centigrade or Celsius (° C.), and the associated temperature gradients during the programming or fusing process may rupture or melt the surroundings of the electrical fuse including contacts and interconnects providing a programming current.

Figure 1:
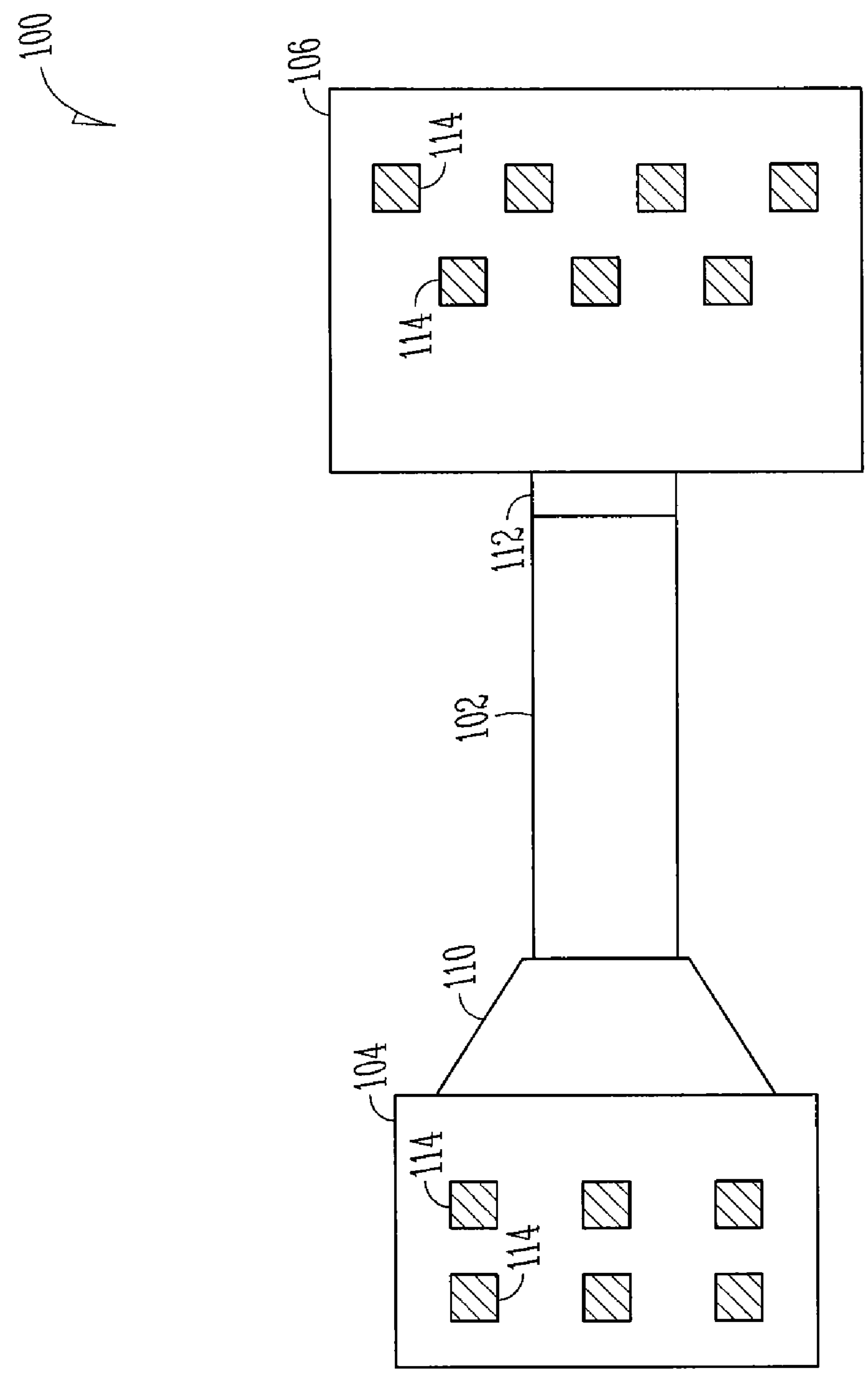
FIG. 1 illustrates a top view of an electrical fuse according to various embodiments.

FIG. 1 illustrates a top view of an electrical fuse 100 according to various embodiments. The electrical fuse includes a fuse link 102 between an anode 104 and a cathode 106. The anode 104 may also be referred to as an anode region, and the cathode 106 may also be referred to as a cathode region. The fuse link 102 includes undoped polysilicon under silicide. The anode 104 and the cathode 106 include highly doped polysilicon under silicide. A tapered end 110 connects the fuse link 102 to the anode 104. The fuse link 102 has a cross-sectional area adjacent the anode 104 equal to or greater than its cross-sectional area adjacent the cathode 106, and the cross-sectional area of the tapered end 110 increases from a central portion of the fuse link 102 to the anode 104. A rectangular connection 112 connects the fuse link 102 to the cathode 106. The fuse link 102, the tapered end 110, and the rectangular connection 112 include undoped polysilicon under a silicide layer. According to various embodiments, the tapered end 110 and the rectangular connection 112 can include highly doped polysilicon under a silicide layer, while the fuse link 102 includes undoped polysilicon under a silicide layer. A number of contacts 114 in the anode 104 and the cathode 106 are available to be connected to programming circuitry (not shown).

Figure 2:
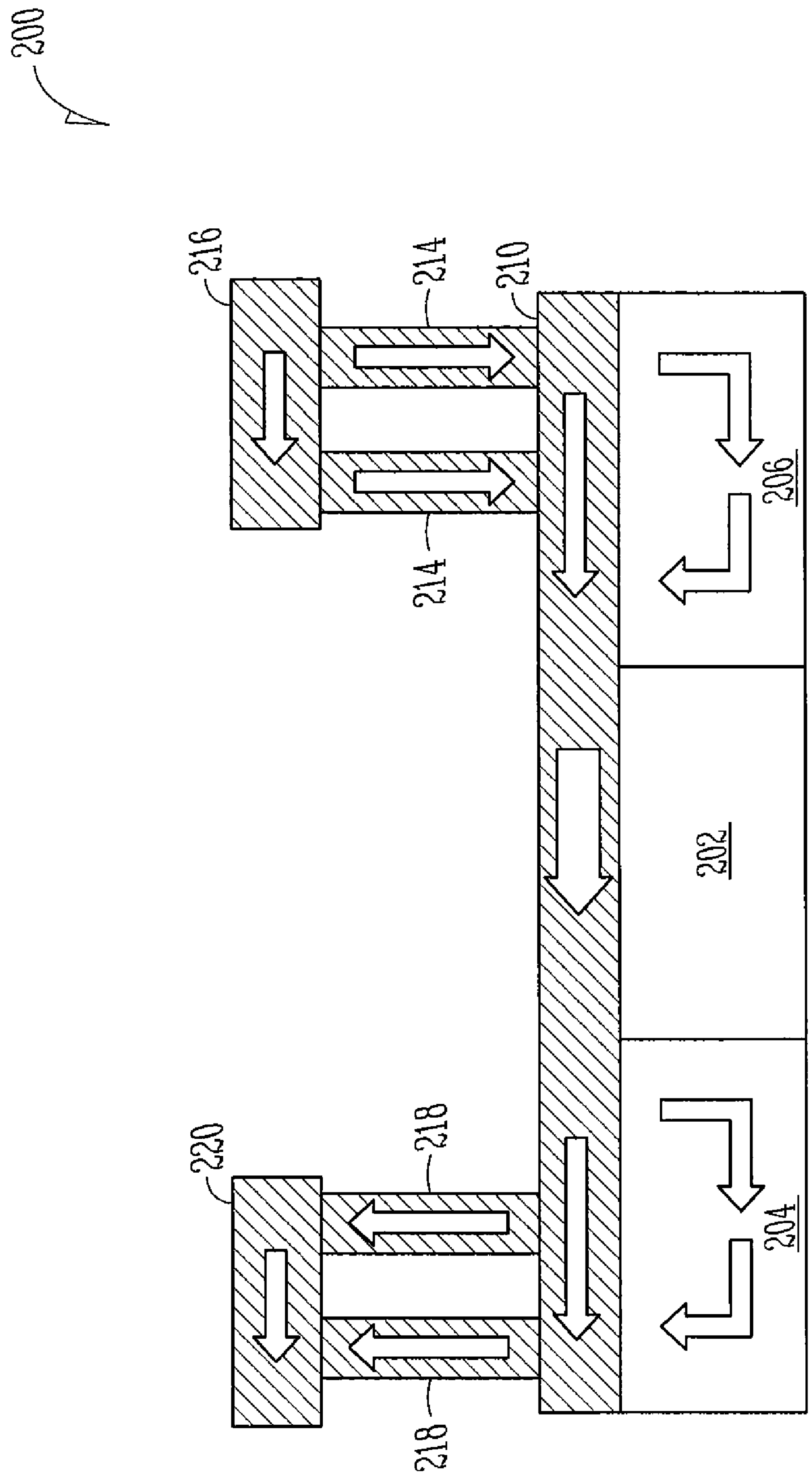
FIG. 2 illustrates cross sectional view of an electrical fuse according to various embodiments.

FIG. 2 illustrates cross sectional view of an electrical fuse 200 according to various embodiments. The electrical fuse 200 has many elements similar to the elements of the electrical fuse 100 shown in FIG. 1, and similar elements in FIGS. 1 and 2 have been given the same names. A fuse link 202 is connected between an anode 204 and a cathode 206. The fuse link 202, the anode 204, and the cathode 206 are under a silicide layer 210. The fuse link 202 includes undoped polysilicon under the silicide layer 210. Both the anode 204 and the cathode 206 include highly doped polysilicon under the silicide layer 210. Multiple contacts 214 connect the silicide layer 210 over the cathode 206 to a first metal interconnect 216. Another set of contacts 218 connect the silicide layer 210 over the anode 204 to a second metal interconnect 220.

Electron current flow in FIG. 2 is shown by arrows without reference characters. When the electrical fuse 200 is programmed, electron current flows from the first metal interconnect 216 through the contacts 214 to the silicide layer 210 and the cathode 206. Substantially all of the electron current then flows in the silicide layer 210 over the fuse link 202 before flowing to the anode 204 and the silicide layer 210 over the anode. Electron current then flows through the contacts 218 to the second metal interconnect 220. No substantial electron current flows through the fuse link 202 due to the high resistance of the undoped polysilicon in the fuse link 202.

The following description applies to the electrical fuses 100, 200 shown in FIGS. 1 and 2. According to various embodiments, the anode 104, 204 and cathode 106, 206 regions include highly doped polysilicon such as n+ or p+ doped polysilicon. Either the same doping is in both the anode 104, 204 and cathode 106, 206 regions or, alternatively, there is different doping in the anode 104, 204 and cathode 106, 206 regions. The fuse link 102, 202 is narrow and includes undoped and highly resistive polysilicon under the silicide layer 210. This results in higher current densities and temperatures in the silicide layer 210 over the fuse link 102, 202 during programming. According to various embodiments, the fuse link 102, 202 includes undoped polysilicon over shallow trench isolation (STI) oxide or local oxidation of silicon (LOCOS) oxide (not shown), the undoped polysilicon being under the silicide layer 210.

The rectangular connection 112 from the cathode 106, 206 region to the fuse link 102, 202 is abrupt, being perpendicular, orthogonal, or re-entrant according to various embodiments. The rectangular connection 112 is abrupt to create a hotspot by current crowding, and to facilitate an electromigration drift of the silicide on top of the undoped polysilicon in the fuse link 102, 202. The tapered end 110 of the fuse link 102, 202 is shown to widen gradually in order to realize a shallow temperature gradient between the fuse link 102, 202 and the anode 104, 204 region and to provide an increasing area for a redeposition of migrated silicide material. The increased area for silicide redeposition helps to reduce crack formations or ruptures in surrounding dielectric material (not shown).

Figure 3:
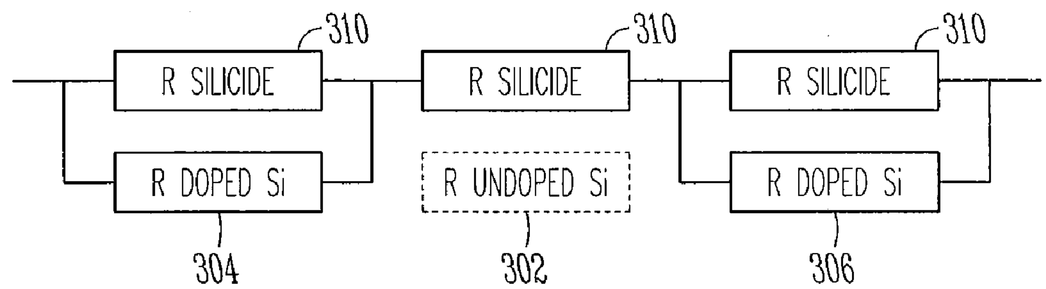
FIG. 3 illustrates an electrical schematic diagram of equivalent resistances in the electrical fuses shown in FIGS. 1 and 2 according to various embodiments.

FIG. 3 illustrates an electrical schematic diagram of equivalent resistances in the electrical fuses 100, 200 shown in FIGS. 1 and 2 according to various embodiments. A resistance of the silicide layer 210 is shown schematically in FIG. 3 as three resistors 310 connected in series. The anode 104, 204 has a resistance 304 of doped polysilicon, and is shown connected in parallel with the resistance 310 of the silicide layer 210 over the anode 104, 204. Similarly, the cathode 106, 206 has a resistance 306 of doped polysilicon, and is shown connected in parallel with the resistance 310 of the silicide layer 210 over the cathode 106, 206. A resistance 302 of the undoped silicon of the fuse link 102, 202 is very high, and is shown as floating or isolated from other resistances shown in FIG. 3. The resistance 302 is such that an insubstantial amount of current flows through the undoped polysilicon of the fuse link 102, 202 during programming.

Programming conditions for the electrical fuses 100, 200 shown in FIGS. 1 and 2 such as a programming pulse voltage, pulse current, pulse duration, and pulse rise and fall times, among others, are selected such that a temperature rise by Joule heating is predominant in the silicide layer 210 over the fuse link 102, 202 according to various embodiments. A maximum temperature in the fuse link 102, 202 should be below 1000° C. so that there is a high enough temperature gradient between the fuse link 102, 202 and the cathode 106, 206 region to allow fast electromigration of the silicide in the silicide layer 210. However, this maximum temperature is still significantly below a melting temperature of the polysilicon and the silicide, which is around 1400-1500° C. At higher temperatures, the undoped polysilicon in the fuse link 102, 202 looses its insulating properties and becomes intrinsically conductive. According to various embodiments, pulses of between 200 and 500 microseconds long are applied between the anode 104, 204 and cathode 106, 206 regions to migrate the silicide in the silicide layer 210. According to various embodiments, the pulses are between 100 nanoseconds and 1 millisecond long.

Programming is more effective with a fast cool down time at the end of the programming pulse. This is to avoid any refill or recombination of voids in the silicide layer 210 due to high temperatures of material near the electrical fuse 100, 200. One factor influencing the cool down time is a fast ramp-down or fall-time of the programming pulse. Another factor helping to freeze the silicide open is a heat sink in the near surrounding of the electrical fuse 100, 200.

Figure 4:
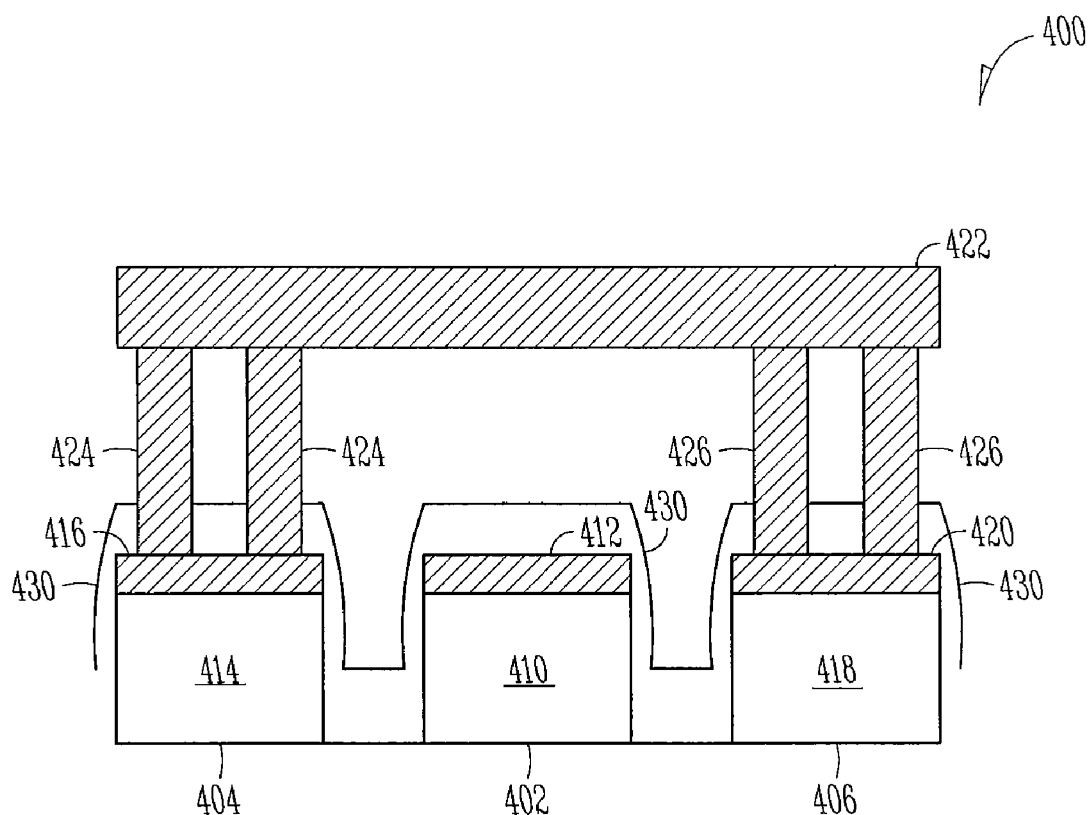
FIG. 4 illustrates a cross sectional view of an electrical fuse with a surrounding heat sink according to various embodiments.

FIG. 4 illustrates a cross sectional view of an electrical fuse 400 with a surrounding heat sink according to various embodiments. The electrical fuse 400 has many elements similar to the elements of the electrical fuses 100, 200 shown in FIGS. 1 and 2, and similar elements in FIGS. 1, 2, and 4 have been given the same names. A fuse link 402 is shown between a first heat sink 404 and a second heat sink 406. The fuse link 402 includes undoped polysilicon 410 under a silicide layer 412. The first heat sink 404 includes highly doped polysilicon 414 under a silicide layer 416. Similarly, the second heat sink 406 includes highly doped polysilicon 418 under a silicide layer 420. The first heat sink 404 is connected to a first metal level (M1) plate or grid 422 by a number of contact plugs 424 connected between the silicide layer 416 and the M1 plate or grid 422. The contact plugs 424 are formed in holes filled with tungsten W, copper Cu or aluminum Al. The M1 plate or grid 422 is made of copper Cu, aluminum Al or tungsten W with respective barrier or liner materials such as tantalum Ta, tantalum nitride TaN, titanium Ti, titanium nitride TiN, titanium tungsten TiW, tungsten carbon nitride WCN, ruthenium Ru, and any combinations thereof. Similarly, the second heat sink 406 is connected to the M1 plate or grid 422 by a number of contact plugs 426 connected between the silicide layer 420 and the M1 plate or grid 422. The fuse link 402 and the heat sinks 404, 406 are covered by a layer or layer stack of dielectric materials, such as silicon nitride Si3N4, silicon carbide SiC, or silicon carbon nitride SiCN, or any combination thereof, as dielectric diffusion barriers or stress liners 430 followed by a pre-metal dielectric including Borophosphosilicate glass (BPSG)., Phosphosilicate glass (PSG), undoped silicon oxide or a low k material, or any combination thereof according to various embodiments.

Figure 5:
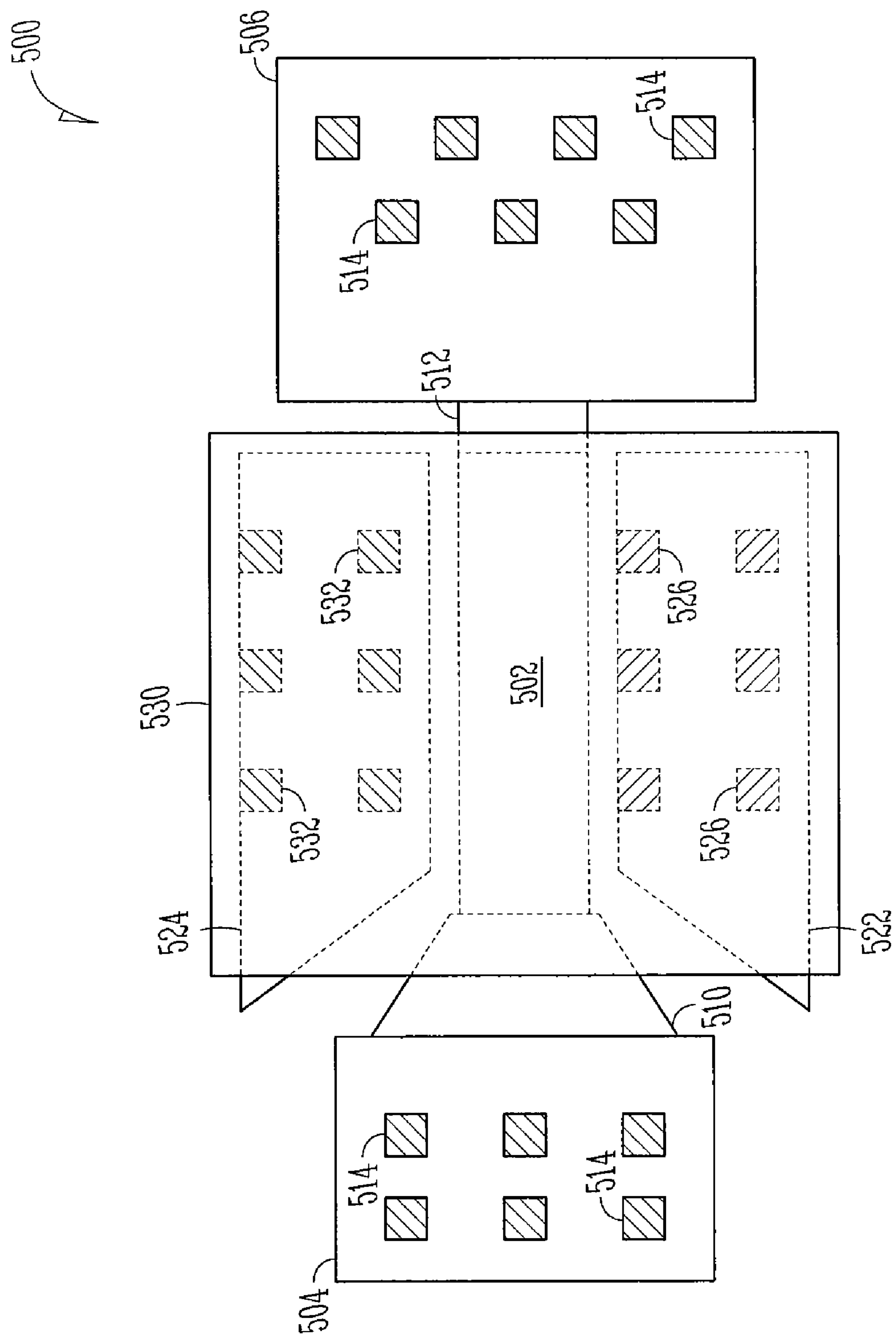
FIG. 5 illustrates a top view of an electrical fuse with a heat sink according to various embodiments.

FIG. 5 illustrates a top view of an electrical fuse 500 with a heat sink according to various embodiments. The electrical fuse 500 has many elements similar to the elements of the electrical fuses 100, 200, 400 shown in FIGS. 1, 2, and 4, and similar elements in FIGS. 1, 2, 4, and 5 have been given the same names. A fuse link 502 is connected between an anode 504 and a cathode 506. The fuse link 502 is connected to the anode 504 by a tapered end 510, and the fuse link 502 is connected to the cathode 506 by a rectangular connection 512. The fuse link 502, the tapered end 510, and the rectangular connection 512 include undoped polysilicon under a silicide layer. According to various embodiments, the tapered end 510 and the rectangular connection 512 include highly doped polysilicon under a silicide layer, while the fuse link 502 includes undoped polysilicon under a silicide layer. Each of the anode 504 and the cathode 506 include highly doped polysilicon under a silicide layer. Both the anode 504 and the cathode 506 have a number of contacts 514 available to be connected to programming circuitry (not shown). Also shown in FIG. 5 are a first heat sink 522 and a second heat sink 524. The first heat sink 522 has a plurality of contact plugs 526 connecting the first heat sink to an M1 plate or grid 530 to transfer heat away from the first heat sink 522. Likewise, the second heat sink 524 has a plurality of contact plugs 532 connecting the second heat sink 524 to the M1 plate or grid 530 to transfer heat away from the second heat sink 524. The M1 plate or grid 530 is over the fuse link 502, the tapered end 510 and the rectangular connection 512. The M1 plate or grid 530 is a blind or screen to be a security measure against an optical inspection of a programming state of the fuse link 502, the anode 504, and the cathode 506.

The following description applies to the electrical fuses 400, 500 shown in FIGS. 4 and 5. The heat sinks 404, 406, 522, 524 may include highly doped polysilicon/silicide stacks with multiple contact plugs up to the M1 plate or grid 422, 530 for temperature distribution. The highly doped polysilicon/silicide stacks may be n+ doped or p+ doped according to various embodiments. The M1 plate or grid 422, 530 can be connected further up to higher metal levels (not shown) in order to facilitate heat transfer. According to various embodiments, the highly doped polysilicon/silicide heat sinks 404, 406, 522, 524 are seated on thin gate oxide directly on top of a highly doped silicon substrate (not shown) to provide better heat transport to the silicon substrate. According to various embodiments, the contact plugs 424, 426, 526, 532 are located directly on a silicided and highly doped silicon substrate (not shown).

Figure 6:
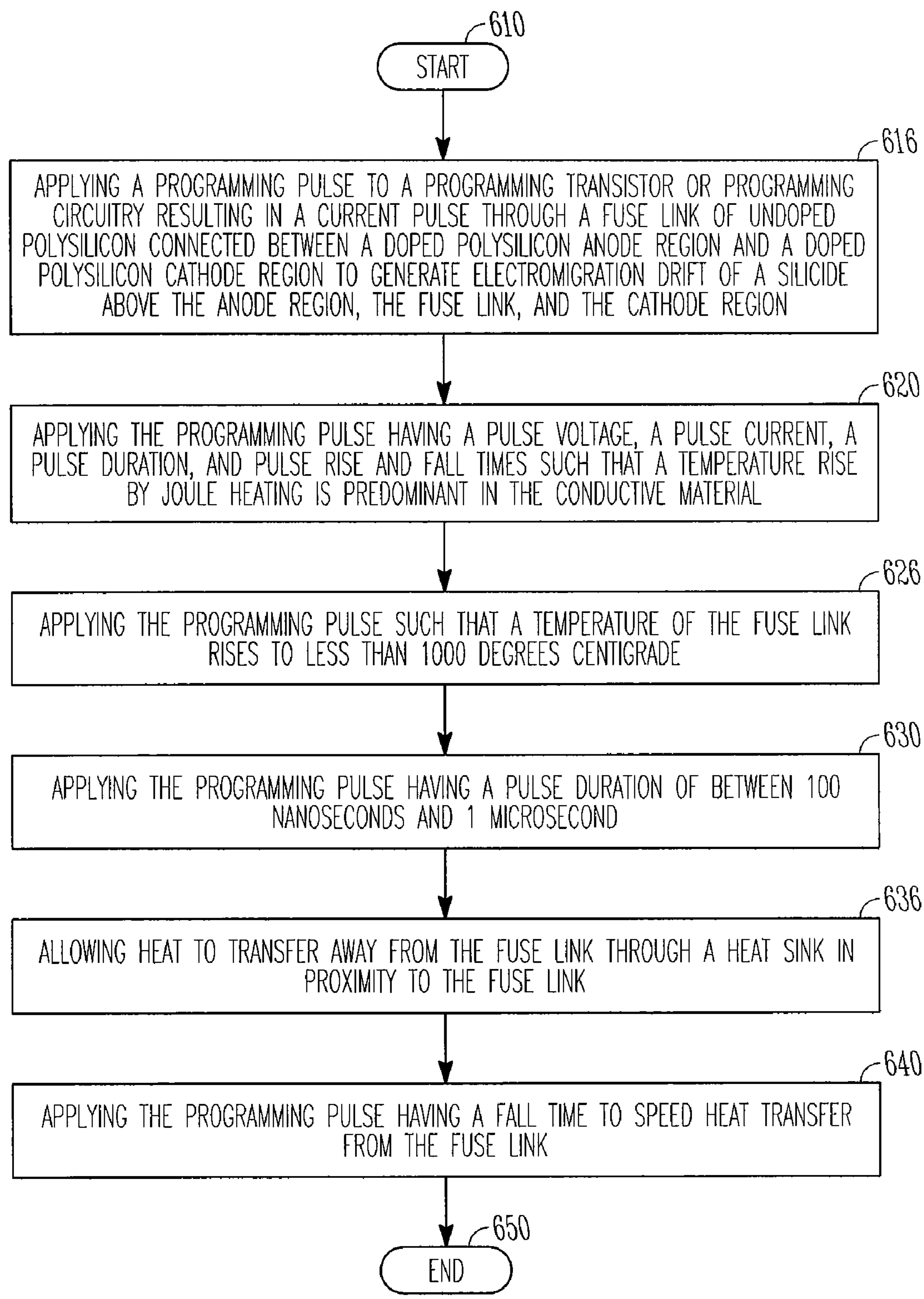
FIG. 6 illustrates a flow diagram of several methods according to various embodiments.

FIG. 6 illustrates a flow diagram of several methods according to various embodiments. In 610, the methods start.

In 616, a programming pulse is applied to a programming transistor or programming circuitry resulting in a current pulse through a fuse link of undoped polysilicon connected between a doped polysilicon anode region and a doped polysilicon cathode region to generate electromigration drift of a silicide above the anode region, the fuse link, and the cathode region.

In 620, the programming pulse is applied having a pulse voltage, a pulse current, a pulse duration, and pulse rise and fall times such that a temperature rise by Joule heating is predominant in the conductive material.

In 626, the programming pulse is applied such that a temperature of the fuse link rises to less than 1000° C.

In 630, the programming pulse is applied having a pulse duration of between 100 nanoseconds and 1 millisecond.

In 636, heat is allowed to transfer away from the fuse link through a heat sink in proximity to the fuse link.

In 640, the programming pulse is applied having a fall time to speed heat transfer from the fuse link. In 650, the methods end.

It should be noted that the individual activities shown in the flow diagram do not have to be performed in the order illustrated or in any particular order. Moreover, various activities described with respect to the methods identified herein can be executed in serial or parallel fashion. Some activities may be repeated indefinitely, and others may occur only once. Various embodiments may have more or fewer activities than those illustrated.

Figure 7:
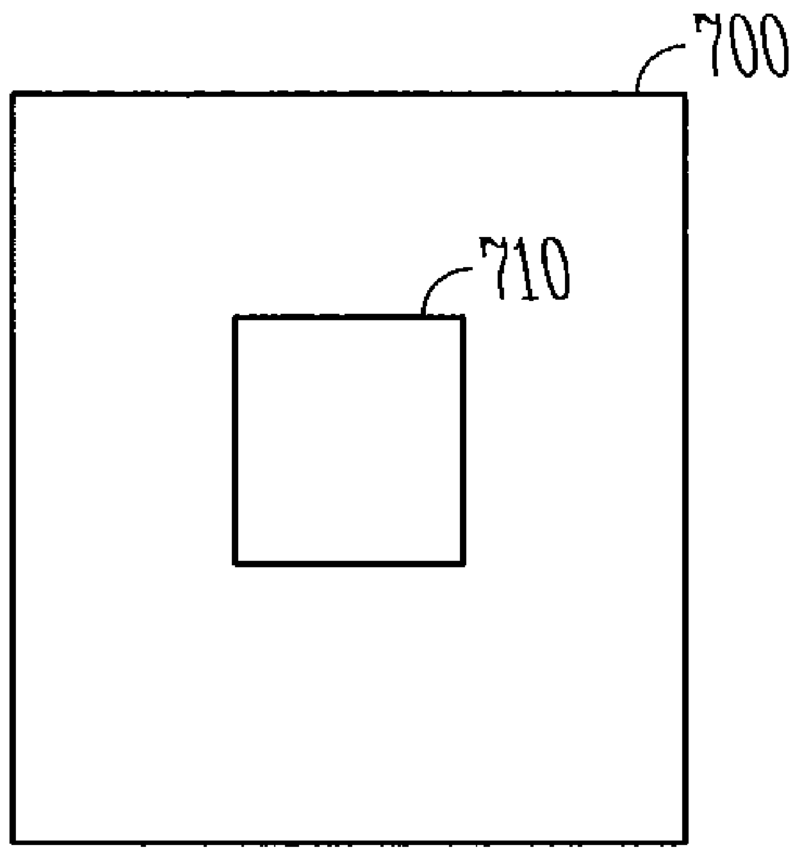
FIG. 7 illustrates a block diagram of an integrated circuit according to various embodiments.

FIG. 7 illustrates a block diagram of an integrated circuit 700 according to various embodiments. The integrated circuit 700 includes a device 710 such as an electrical fuse or an array of electrical fuses according to any of the embodiments described herein. According to various embodiments, the integrated circuit 700 is a microprocessor, a microcontroller, a telecommunications device, an ASIC device, a system-on-a-chip device, an analog-mixed signal device, a radio frequency (RF) device, a power device, or a memory device, or any combination thereof.

Each silicide layer described herein is selected from the group consisting of one or more of cobalt silicide, nickel silicide, platinum silicide, nickel platinum silicide, titanium silicide, tungsten silicide, ytterbium silicide, nickel ytterbium silicide, erbium silicide, and palladium silicide, in any combination according to various embodiments.

An electrical fuse is shown and described herein. According to various embodiments, the electrical fuse includes an undoped polysilicon/silicide fuse link between highly doped polysilicon/silicide cathode and anode regions. The cathode and anode regions may be n+ doped or p+ doped according to various embodiments. The electrical fuse according to various embodiments results in higher fuse current concentration and higher temperature gradients during programming. An increase in the resistance of the fuse link is due to void formation in the silicide layer because of silicide electromigration in the fuse link.

A heat sink around the fuse link improves a freeze of voids in the silicide according to various embodiments. Various embodiments described herein have utility for a programmed electrical fuse during temperature storage. Various embodiments described herein have heat distribution and heat dissipation and help to avoid rupture cracks in surrounding dielectric material.

The electrical fuse construction and modified layout including its surroundings according to various embodiments described herein address the above mentioned reliability issues such as a rupture of surrounding material and a resistance drift of a programmed electrical fuse. Temperature control during programming of the fuse link as well as in the near surrounding of the electrical fuse also addresses the reliability issues. The high temperature necessary to support an electromigration of silicide on top of polysilicon does not spread substantially from the fuse link to the cathode and anode regions of the electrical fuse or to the surroundings of the electrical fuse according to various embodiments. Therefore, the melting of filled contacts such as Tungsten plugs, Copper fill, and Aluminum fill, for example, in the cathode or anode regions is substantially reduced. Rupture cracks, which may extend to first metal level interconnect lines, can be substantially reduced as well.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments of the invention. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

In addition, in the foregoing Detailed Description, it can be seen that various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment.

Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

The invention claimed is:

1. An apparatus comprising:

a fuse link of undoped material connected between first and second contact regions;

a layer of conductive material above the first and second contact regions and the fuse link; and a heat sink in proximity to the fuse link, the heat sink in proximity of the fuse link having an obtusely formed end.

2. The apparatus of claim 1, wherein the first and second contact regions include doped polysilicon.

3. The apparatus of claim 1, wherein the first contact region is an anode region and the second contact region is a cathode region.

4. The apparatus of claim 1, wherein the heat sink includes polysilicon.

5. The apparatus of claim 1, wherein the heat sink includes contact plugs to be coupled to a first metal level.

6. The apparatus of claim 1, wherein the heat sink includes contact plugs to be coupled to a first metal level to transfer heat away from the heat sink.

7. The apparatus of claim 1, wherein the heat sink includes contact plugs to be coupled to a first metal level, the first metal level forming a metal grid or a metal plate over the fuse link.

8. The apparatus of claim 7, wherein the metal grid or metal plate is a blind or screen to be a security measure against an optical inspection of a programming state of the fuse link and the first and second contact regions.

9. The apparatus of claim 1, wherein the heat sink includes:
- doped polysilicon;
- a silicide layer over the doped polysilicon;
- contact plugs connected between the silicide layer and a metal grid or a metal plate.

10. The apparatus of claim 9, wherein:
- the doped polysilicon of the heat sink is n+ doped or p+ doped polysilicon on thin gate oxide on top of a doped silicon substrate; and
- the fuse link and the heat sink are covered by a layer or layer stack of dielectric material.

11. The apparatus of claim 5, further comprising a plurality of second metal levels coupled to the first metal level to transfer heat away from the heat sink.

12. The apparatus of claim 1, wherein the first and second contact regions include doped polysilicon.

13. The apparatus of claim 1, wherein the heat sink includes doped polysilicon.

14. The apparatus of claim 1, wherein the conductive material is silicide.

15. The apparatus of claim 1, wherein the conductive material is selected from the group consisting of one or more of cobalt silicide, nickel silicide, platinum silicide, nickel platinum silicide, titanium silicide, tungsten silicide, ytterbium silicide, nickel ytterbium silicide, erbium silicide, and palladium silicide, in any combination.

16. The apparatus of claim 1, wherein the fuse link is formed over shallow trench isolation (STI) oxide or local oxidation of silicon (LOGOS) oxide.

17. The apparatus of claim 1, wherein the heat sink includes doped polysilicon and is between a silicide layer and shallow trench isolation (STI) oxide or local oxidation of silicon (LOGOS) oxide.

18. An apparatus comprising:
- a fuse link of undoped material connected between first and second doped material contact regions, the first contact region being an anode region and the second contact region being a cathode region;
- a layer of conductive material above the first and second contact regions and the fuse link; and
- a heat sink adjacent the fuse link,
- wherein one end of the fuse link is connected to the cathode region through an orthogonal connection to cause current crowding to create a hotspot and facilitate electromigration drift of the conductive material above the fuse link, an another end of the fuse link is connected to the anode region through a tapered to a gradually increasing cross-sectional connection, and the heat sink adjacent the fuse link includes an obtusely formed end in a vicinity of the gradually increasing cross-sectional connection.

19. The apparatus of claim 1, wherein the cross-sectional connection of the fuse link increases from a central portion of the fuse link to the anode region.

20. The apparatus of claim 18, wherein the conductive material is silicide.

21. The apparatus of claim 20, wherein the conductive material is selected from the group consisting of one or more of cobalt silicide, nickel silicide, platinum silicide, nickel platinum silicide, titanium silicide, tungsten silicide, ytterbium silicide, nickel ytterbium silicide, erbium silicide, and palladium silicide, in any combination.

22. The apparatus of claim 18, wherein at least one of the anode region and the cathode region includes contacts to be coupled to programming circuitry.

23. The apparatus of claim 18, wherein the heat sink includes doped polysilicon.

24. The apparatus of claim 18, wherein the heat sink includes contact plugs to couple to a metal level.

25. The apparatus of claim 18, wherein the heat sink includes contact plugs to transfer heat away from the fuse link.

26. The apparatus of claim 18, wherein the heat sink includes a layer of conductive material above a doped material region, the heat sink further including contact plugs to couple to a first metal level to cool the heat sink region.

27. The apparatus of claim 26, wherein the conductive material is silicide and the doped material is doped polysilicon.

28. The apparatus of claim 26, further comprising a plurality of second metal levels coupled to the first metal level to cool the heat sink.

29. The apparatus of claim 18, wherein the first and second contact regions include p-doped polysilicon.

30. The apparatus of claim 18, wherein the first and second contact regions include n-doped polysilicon.

31. The apparatus of claim 18, wherein the first and second contact regions are oppositely doped.

32. The apparatus of claim 18, wherein the first contact region includes n-doped polysilicon and the second contact region includes p-doped polysilicon.

33. The apparatus of claim 18 wherein the fuse link includes undoped polysilicon over shallow trench isolation (STI) oxide or local oxidation of silicon (LOGOS) oxide, the undoped polysilicon being under the layer of conductive material.

34. A system comprising:
- an integrated circuit; and
- an electrical fuse in the integrated circuit including:
  - a fuse link of undoped material connected between first and second doped material contact regions, the first contact region being an anode region and the second contact region being a cathode region;
  - a layer of conductive material above the first and second contact regions and the fuse link; and
  - a heat sink adjacent the fuse link,
  - wherein one end of the fuse link is connected to the cathode region through an orthogonal connection to cause current crowding to create a hotspot and facilitate electromigration drift of the conductive material above the fuse link, an another end of the fuse link is connected to the anode region through a tapered to a gradually increasing cross-sectional connection, and the heat sink adjacent the fuse link includes an obtusely formed end in a vicinity of the gradually increasing cross-sectional connection.

35. The system of claim 34, wherein the conductive material is silicide.

36. The system of claim 34, wherein the heat sink includes: doped polysilicon; and contact plugs to couple to a metal level.

37. The system of claim 34, wherein the first and second contact regions include doped polysilicon and the fuse link includes undoped polysilicon.

38. The system of claim 34, wherein the electrical fuse is in an array of electrical fuses.

39. The system of claim 34, wherein the integrated circuit is selected from the group consisting of one or more of a microprocessor, a microcontroller, a telecommunications device, an ASIC device, a system-on-a-chip device, an analog-mixed signal device, a radio frequency (RF) device, a power device, or a memory device, in any combination.

* * * * *